United States Patent
Wang et al.

(10) Patent No.: US 11,032,925 B2
(45) Date of Patent: Jun. 8, 2021

(54) FLEXIBLE DISPLAY PANEL AND FLEXIBLE DISPLAY DEVICE

(71) Applicant: KUNSHAN GO-VISIONOX OPTO-ELECTRONICS CO., LTD, Jiangsu (CN)

(72) Inventors: Gang Wang, Jiangsu (CN); Weilong Li, Jiangsu (CN); Lu Zhang, Jiangsu (CN); Siming Hu, Jiangsu (CN); Zhenzhen Han, Jiangsu (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 0 days.

(21) Appl. No.: 16/853,921

(22) Filed: Apr. 21, 2020

(65) Prior Publication Data

US 2020/0267850 A1    Aug. 20, 2020

Related U.S. Application Data

(63) Continuation of application No. PCT/CN2019/071916, filed on Jan. 16, 2019.

(30) Foreign Application Priority Data

Sep. 29, 2018    (CN) .......................... 201821605052.1

(51) Int. Cl.
  *H05K 1/02*     (2006.01)
  *H05K 5/00*     (2006.01)
  *H05K 1/03*     (2006.01)

(52) U.S. Cl.
  CPC ......... *H05K 5/0017* (2013.01); *H05K 1/0277* (2013.01); *H05K 1/0306* (2013.01);
  (Continued)

(58) Field of Classification Search
  CPC .. H05K 5/0017; H05K 1/0277; H05K 1/0306; H05K 2201/09036; H05K 2201/10128
  (Continued)

(56) References Cited

U.S. PATENT DOCUMENTS

2015/0022430 A1    1/2015  Namkung
2017/0040406 A1*   2/2017  Park .................... H01L 51/56
(Continued)

FOREIGN PATENT DOCUMENTS

CN     107170776 A     9/2017
CN     107424519 A    12/2017
(Continued)

OTHER PUBLICATIONS

ISR_for_International_Application_PCTCN2019071916.
(Continued)

*Primary Examiner* — Sherman Ng
(74) *Attorney, Agent, or Firm* — Ladas & Parry LLP

(57) ABSTRACT

Providing are a flexible display panel and flexible display device. The flexible display panel includes a display area and a non-display area surrounding the display area. The non-display area includes a flexible substrate, an inorganic layer and a metal wire stacked together. An overlapping area exists between the non-display area and a bending area of the flexible display panel. In the overlapping area, at least one groove is formed on the inorganic layer, and the metal wire is at least partially arranged in the at least one groove.

15 Claims, 8 Drawing Sheets

(52) U.S. Cl.
   CPC .............. *H05K 2201/09036* (2013.01); *H05K 2201/10128* (2013.01)

(58) Field of Classification Search
   USPC ......................................................... 361/749
   See application file for complete search history.

(56) References Cited

U.S. PATENT DOCUMENTS

2017/0229674 A1* 8/2017 Jin ...................... H01L 51/0097
2018/0175311 A1* 6/2018 Jin ...................... H01L 27/3258
2018/0197935 A1* 7/2018 Yuan ................... H01L 51/0097

FOREIGN PATENT DOCUMENTS

| CN | 108242462 A | 7/2018 |
| CN | 109273503 A | 1/2019 |
| TW | 200844925 A | 11/2008 |

OTHER PUBLICATIONS

CN 109273503 A _ English Abstract.
CN 107424519 A _ English Abstract.
CN 108242462 A _ English Abstract.
CN 107170776 A _ English Abstract.
TW 200844925 A _ English Abstract.

\* cited by examiner

FLEXIBLE DISPLAY PANEL AND FLEXIBLE DISPLAY DEVICE

CROSS-REFERENCE TO RELATED APPLICATIONS

This application is a continuation of International patent application No. PCT/CN2019/071916 filed on Jan. 16, 2019, which claims priority to Chinese patent application No. 201821605052.1 filed on Sep. 29, 2018, contents of both of which are incorporated herein by reference in their entireties.

TECHNICAL FIELD

The present disclosure relates to display technology and, particularly, to a flexible display panel and flexible display device.

BACKGROUND

As a flexible display panel has the characteristics of lightness, thinness, portability, bending resistance and aesthetic design, the research and innovation of the flexible display panel are getting more and more attention.

However, in a bending process of the flexible display panel, as metal wires are arranged in a peripheral circuit of the flexible display panel, the metal wires may easily break when the flexible display panel is bent.

SUMMARY

The present disclosure provides a flexible display panel and flexible display device, to avoid the breakage of the metal wires and improve the bending resistance of the flexible display panel.

In the first aspect, the present disclosure provides a flexible display panel. The flexible display panel includes a display area and a non-display area surrounding the display area.

The non-display area includes a flexible substrate, an inorganic layer and a metal wire stacked together. An overlapping area exists between the non-display area and a bending area of the flexible display panel. In the overlapping area, at least one groove is formed on the inorganic layer, and the metal wire is at least partially arranged in the at least one groove.

Optionally, the at least one groove has a same size as the overlapping area along an extension direction of the metal wire, and a portion of the metal wire in the overlapping area is located in the at least one groove.

Optionally, the portion of the metal wire in the overlapping area is attached to an inner wall of the at least one groove.

Optionally, the depth of the at least one groove is equal to the thickness of the inorganic layer through completely etching the inorganic layer at the at least one groove.

Optionally, the inorganic layer includes a buffer layer and at least one insulating layer stacked together. The buffer layer is arranged at a side of the at least one insulating layer adjacent to the flexible substrate.

Optionally, the at least one groove passes through all of the least one insulating layer in the inorganic layer along a direction perpendicular to the flexible substrate.

Optionally, the inorganic layer includes the buffer layer, a first insulating layer, a second insulating layer and a third insulating layer stacked together. The at least one groove passes through the first insulating layer, the second insulating layer and the third insulating layer along the direction perpendicular to the flexible substrate.

Optionally, the flexible substrate includes a first flexible layer, a first inorganic layer and a second flexible layer. The second flexible layer is arranged at a side of the first inorganic layer adjacent to the metal wire.

Optionally, along the direction perpendicular to the flexible substrate, the at least one groove passes through the second flexible layer, or the at least one groove passes through the second flexible layer and the first inorganic layer.

Optionally, a planarization layer and a pixel definition layer are arranged at a side of the metal wire far away from the inorganic layer. The pixel definition layer is arranged at a side of the planarization layer far away from the metal wire.

A sum of the thickness of the planarization layer and the thickness of the pixel definition layer is equal to the thickness of the first flexible layer.

Optionally, a cross-sectional shape of the at least one groove is a trapezoid along a direction perpendicular to the flexible substrate and parallel to an extension direction of the metal wire, and a short side of the trapezoid is close to the flexible substrate.

Optionally, the cross-sectional shape of the at least one groove is a trapezoid with rounded corners.

Optionally, a plurality of through-holes is arranged on the metal wire in the overlapping area.

Optionally, the metal wire has a width greater than or equal to 30 microns.

Optionally, the metal wire includes a power signal line and a clock signal line.

In the second aspect, the present disclosure further provides a flexible display device. The flexible display device includes the flexible display panel provided by any embodiment of the present disclosure.

Optionally, the flexible display device further includes a drive circuit board. The drive circuit board is configured to send a display drive signal to the display panel.

DETAILED DESCRIPTION

Figure 1:
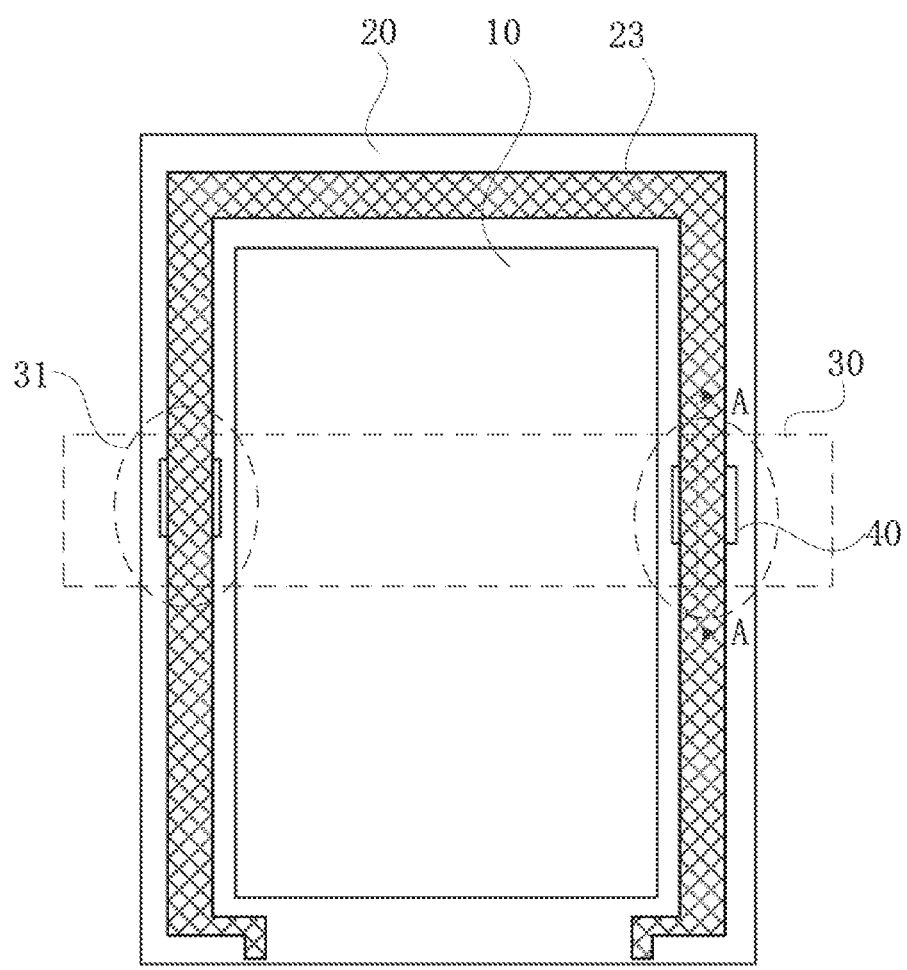
FIG. 1 is a plane diagram of a flexible display panel provided by an embodiment.
Figure 2:
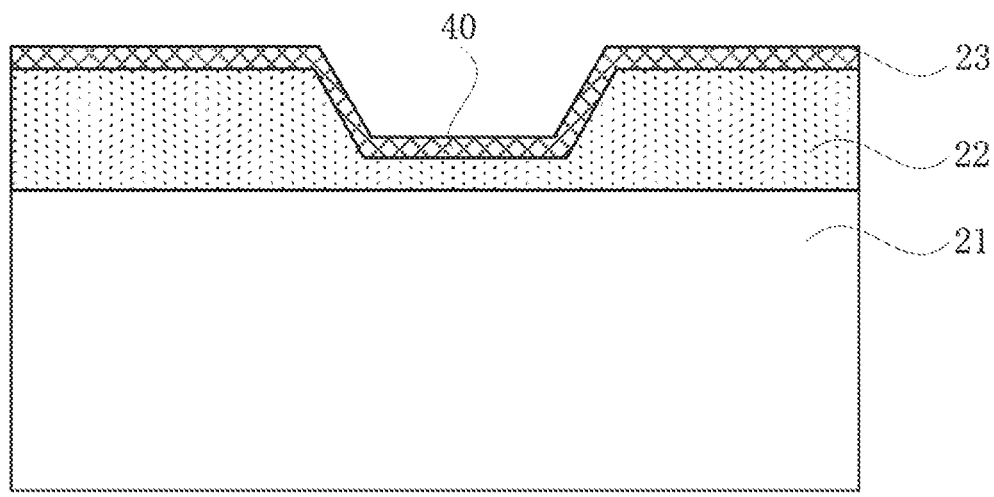
FIG. 2 is a cross-sectional diagram of the display panel shown in FIG. 1 along a section line AA.

The present disclosure provides a flexible display panel. FIG. 1 is a plane diagram of the flexible display panel provided by an embodiment. FIG. 2 is a cross-sectional diagram of the display panel shown in FIG. 1 along a section line AA. Referring to FIG. 1 and FIG. 2, the flexible display panel includes a display area 10 and a non-display area 20.

The non-display area 20 includes a flexible substrate 21, an inorganic layer 22 and a metal wire 23 stacked together. An overlapping area 31 exists between the non-display area 20 and a bending area 30 of the flexible display panel. In the overlapping area 31, at least one groove 40 is formed on the inorganic layer 22, and the metal wire 23 is at least partially arranged in the groove 40.

In the present disclosure, "the bending area" refers to an area where the flexible display panel is deformed when bent. One flexible display panel may include only one bending area, or may include multiple bending areas. There is no limitation on the number of the bending areas in the present disclosure.

Specifically, when the flexible display panel is bent, the metal wire 23 located in the bending area 30 may easily break, so as to affect signal transmission. The at least one groove 40 is formed in the overlapping area 31 between the bending area 30 and the non-display area 20, and the metal wire 23 is partially arranged in the 40, so that a height difference of the metal wire 23 is formed at the at least one groove 40. This is beneficial to relief of the stress on the flexible display panel when the flexible display panel is bent, and improvement of the bending resistance of the metal wire 23, so as to avoid the breakage of the metal wire 23, and improve the bending resistance of the flexible display panel.

In addition, FIG. 1 only shows an example that each overlapping area 31 has one groove 40, which is not the limitation of the present disclosure. In other embodiments, multiple grooves 40 may be formed in each overlapping area 31. In addition, FIG. 1 only shows an example that, in the same overlapping area 31, one metal wire 23 is located in one groove 40. In other embodiments, in the same overlapping area 31, multiple metal wires 23 may be located in the same groove 40, or the same metal wire 23 may be located in multiple grooves 40. This is not specifically limited in the present disclosure.

In an embodiment, referring to FIG. 2, a portion of the metal wire 23 in the overlapping area 31 is attached to an inner wall of the groove 40, so that contact area between the metal wire 23 and the inorganic layer 22 is larger, and the metal wire 23 does not fall off easily when the flexible display panel is bent. This improves the bending resistance of the metal wire 23.

Figure 3:
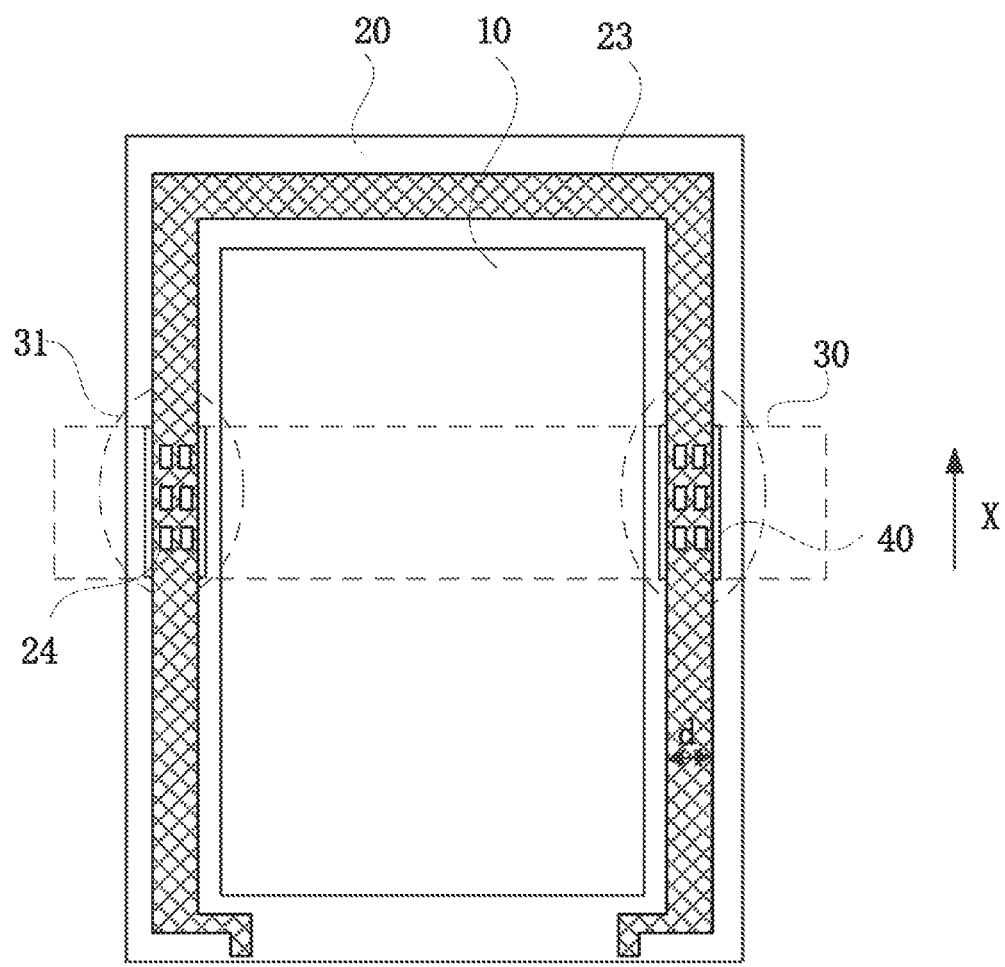
FIG. 3 is a plane diagram of another flexible display panel provided by an embodiment, in which a plurality of through-holes is arranged on the metal wire in the overlapping area.

FIG. 3 is a plane diagram of another flexible display panel provided by an embodiment. In the embodiment, referring to FIG. 3, the groove 40 has a same size as the overlapping area 31 along an extension direction of the metal wire 23, and the portion of the metal wire 23 in the overlapping area 31 is located in the groove 40.

Through this arrangement, the size of the groove 40 is larger, the process difficulty is reduced and a height difference of the metal wire 23 is formed between the bending area 30 and a non-bending area. This is beneficial to relief of the stress on the metal wire 23 in the entire overlapping area 31 when the flexible display panel is bent, and further improvement of the bending resistance of the metal wire 23, so as to avoid the breakage of the metal wire 23, and improve the bending resistance of the flexible display panel.

In an embodiment, referring to FIG. 3, the width d of the metal wire 23 is greater than or equal to 30 microns.

Specifically, the metal wire 23 with the width d greater than or equal to 30 microns may easily break when the flexible display panel is bent. The metal wire 23 is at least partially arranged in the groove 40, so that the breakage of the metal wire is significantly avoided, and the bending resistance of the flexible display panel is improved.

In an embodiment, the metal wire 23 includes a power signal line and a clock signal line. Specifically, the flexible display panel includes some metal wires 23 with larger widths, such as the power signal line and the clock signal line. The widths of the power signal line and the clock signal line may even reach 200-500 microns. The power signal line and the clock signal line may easily break when the flexible display panel is bent. In the embodiment, the groove 40 is formed in the overlapping area 31, and the power signal line and the clock signal line are at least partially arranged in the at least one groove 40, which are beneficial to increase of the bending resistance of the power signal line and the clock signal line. Thus the breakage of the power signal line and the clock signal line are avoided and the bending resistance of the flexible display panel is improved.

In addition, the embodiment only shows an example that the metal wire 23 is the power signal line and the clock signal line, which is not the limitation of the present disclosure. In other embodiments, the metal wire 23 may also be other signal lines with larger widths.

In addition, referring to FIG. 3, multiple through-holes 24 are arranged on the metal wire 23. For example, the multiple through-holes 24 are arranged on the metal wire 23 in the overlapping area 31. When the flexible display panel is bent, the multiple through-holes 24 may significantly relieve the stress on the metal wire 23, so as to further improve the bending resistance of metal wire 23, and improve the bending resistance of flexible display panel.

Figure 4:
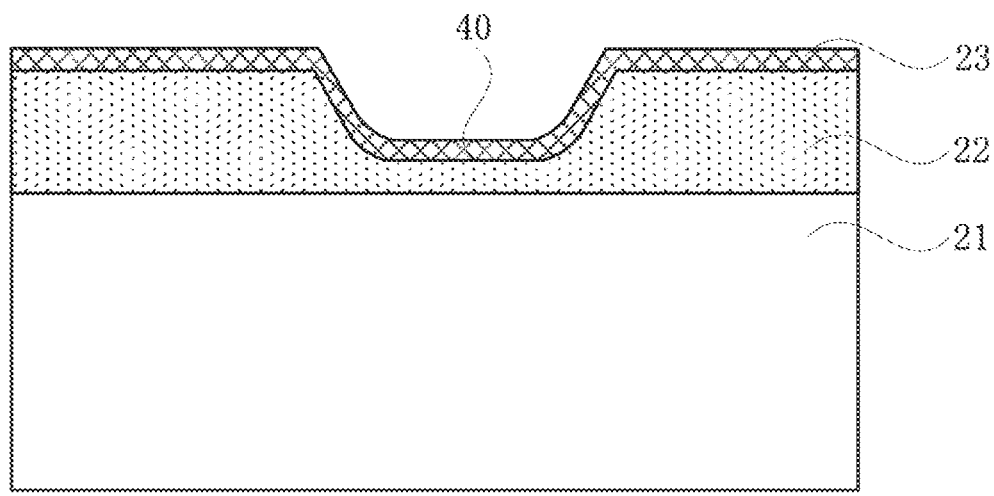
FIG. 4 is a cross-sectional diagram of a flexible display panel provided by an embodiment.

FIG. 4 is a cross-sectional diagram of a flexible display panel provided by an embodiment. In the embodiment, referring to FIG. 2 to FIG. 4, a cross-sectional shape of the at least one groove 40 is a trapezoid, and a short side of the trapezoid is close to the flexible substrate 21. The cross-section is perpendicular to the flexible substrate 21 and parallel to an extension direction of the metal wire 23 in the overlapping area 31.

Specifically, the cross-sectional shape of the groove 40 is arranged as the trapezoid, so that an angle between a surface of the inorganic layer 22 far away from the flexible substrate 21 and a side wall of the groove 40 is greater than 90 degrees, and the side wall and a bottom of the groove is greater than 90 degrees. In this way, the transition of metal wire 23 is smoother, which may significantly avoid stress concentration and is beneficial to improve the bending resistance of metal wire 23.

In addition, in an embodiment, the cross-sectional shape of the groove 40 is a trapezoid with rounded corners. The cross-sectional shape of the groove 40 is arranged to be the trapezoid with rounded corners, that is, the angle between the bottom and the side wall of the groove 40 is an arc angle, so that the transition of metal wire 23 at the arc angle is smoother. This further avoids the stress concentration, and is beneficial to improve the bending resistance of metal wire 23.

Figure 5:
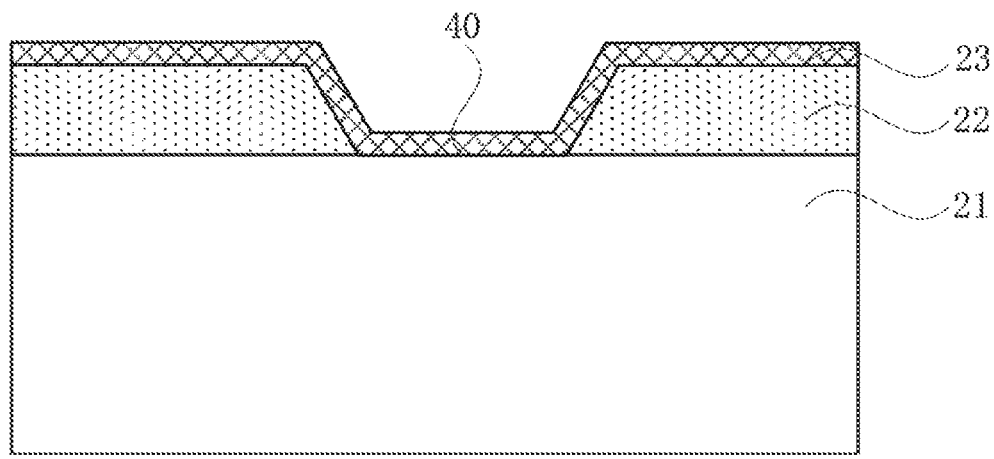
FIG. 5 is a cross-sectional diagram of another flexible display panel provided by an embodiment, with different shape of the at least one groove from that of FIG. 4.

FIG. 5 is a cross-sectional diagram of another flexible display panel provided by an embodiment. In the embodiment, referring to FIG. 5, the depth of the groove 40 is equal to the thickness of the inorganic layer 22.

Specifically, since the inorganic layer 22 is relatively thin, through completely etching the inorganic layer 22 at the groove 40, the height difference of the metal wire 23 in the groove 40 is relatively large. This is more beneficial to relieve the stress on the metal line 23 when the flexible display panel is bent, so as to better avoid the breakage of the metal wire 23.

In an embodiment, the inorganic layer includes a buffer layer and at least one insulating layer stacked together. The buffer layer is arranged at a side of the insulating layer adjacent to the flexible substrate. The groove passes through all of the least one insulating layer in the inorganic layer along the direction perpendicular to the flexible substrate.

Specifically, if the metal wire is formed by a metal sputtering process, when the metal wire is formed by directly sputtering on the flexible substrate, the flexible substrate may be damaged easily and a machine used for sputtering may be contaminated easily. Therefore, through retaining the buffer layer at the bottom of the groove, the damage to the flexible substrate and contamination to the machine may be avoided.

Figure 6:
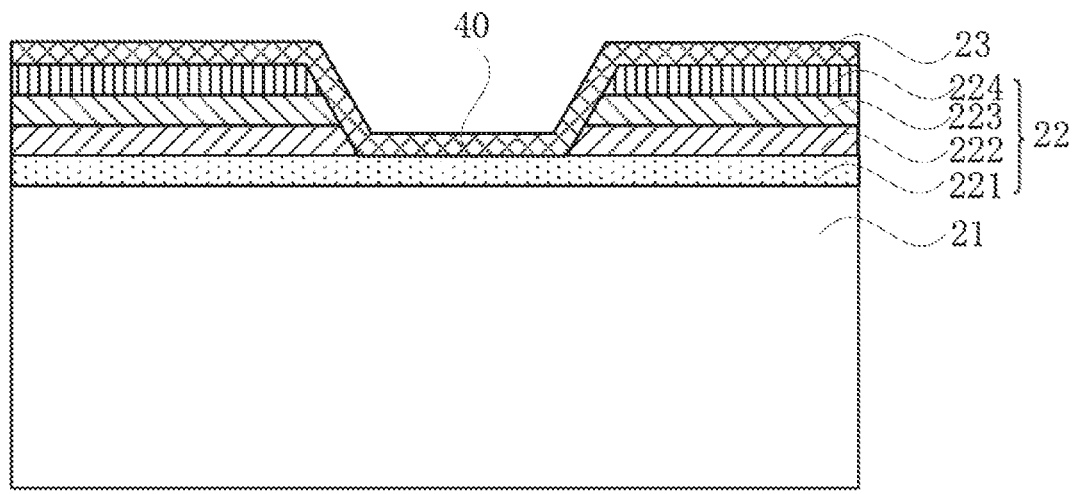
FIG. 6 is a cross-sectional diagram of another flexible display panel provided by an embodiment, in which the inorganic layer includes the buffer layer, a first insulating layer, a second insulating layer and a third insulating layer stacked together.

For example, FIG. 6 is a cross-sectional diagram of another flexible display panel provided by an embodiment. Referring to FIG. 6, the inorganic layer 22 includes the buffer layer 221, a first insulating layer 222, a second insulating layer 223 and a third insulating layer 224 stacked together. The buffer layer 221 is arranged at the side of the first insulating layer 222 adjacent to the flexible substrate 21. The groove 40 passes through the first insulating layer 222, the second insulating layer 223 and the third insulating layer 224 along the direction perpendicular to the flexible substrate 21.

Specifically, the first insulating layer 222 may be an insulating layer between an active layer and a gate layer in a drive circuit of the flexible display panel. The second insulating layer 223 may be an insulating layer between the gate layer and a capacitor electrode plate layer. The third insulating layer 224 may be an insulating layer between the capacitor electrode plate layer and a source and drain layer.

In addition, the groove 40 passes through the first insulating layer 222, the second insulating layer 223 and the third insulating layer 224, that is, the depth of the groove 40 is equal to a sum of the thickness of the first insulating layer 222, the thickness of the second insulating layer 223 and the thickness of the third insulating layer 224.

Figure 7:
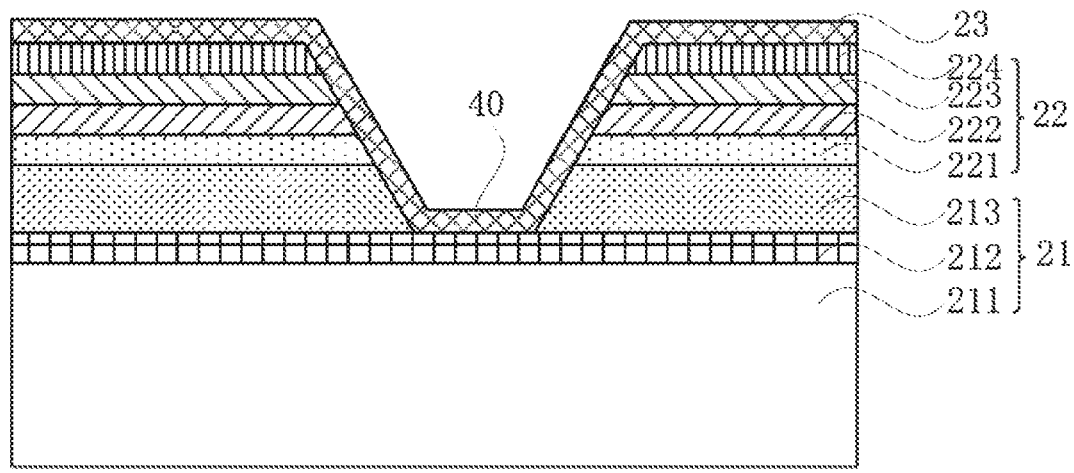
FIG. 7 is a cross-sectional diagram of another flexible display panel provided by an embodiment, in which the flexible substrate includes a first flexible layer, a first inorganic layer and a second flexible layer stacked together.
Figure 8:
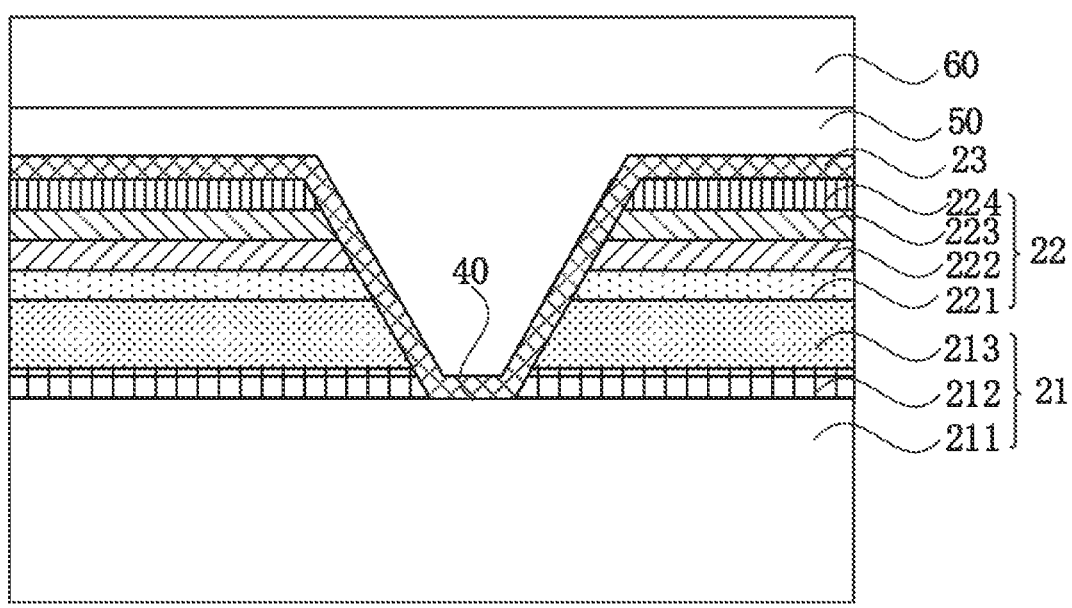
FIG. 8 is a cross-sectional diagram of another flexible display panel provided by an embodiment, in which layers such as a planarization layer and a pixel definition layer are arranged at a side of the metal wire far away from the inorganic layer.

FIG. 7 is a cross-sectional diagram of another flexible display panel provided by an embodiment. FIG. 8 is a cross-sectional diagram of another flexible display panel provided by an embodiment. In an embodiment, referring to FIG. 7 and FIG. 8, the flexible substrate 21 includes a first flexible layer 211, a first inorganic layer 212 and a second flexible layer 213 stacked together. The second flexible layer 213 is arranged at a side of the first inorganic layer 211 adjacent to the metal wire 23.

Along the direction perpendicular to the flexible substrate 21, the groove 40 passes through the second flexible layer 213, or the groove 40 passes through the second flexible layer 213 and the first inorganic layer 212.

Specifically, layers such as a planarization layer 50 and a pixel definition layer 60 are arranged at a side of the metal wire 23 far away from the inorganic layer 22. The pixel definition layer 60 is arranged at a side of the planarization layer 50 far away from the metal wire 23. The total thickness of layers at a side of metal wire 23 far from the inorganic layer 22 is comparable to the thickness of the first flexible layer 211, that is, the total thickness of the layers at the side of metal wire 23 far from the inorganic layer 22 is equal to or close to the thickness of the first flexible layer 211. The groove 40 is arranged to pass through the second flexible layer 213 or the groove 40 is arranged to pass through the first inorganic layer 212 and the second flexible layer 213, so that two sides of each of the groove 40 form an approximately symmetrical structure. This may improve the bending resistance of the metal wire 23, and is beneficial to improvement of the bending resistance of the entire flexible display panel.

Figure 9:
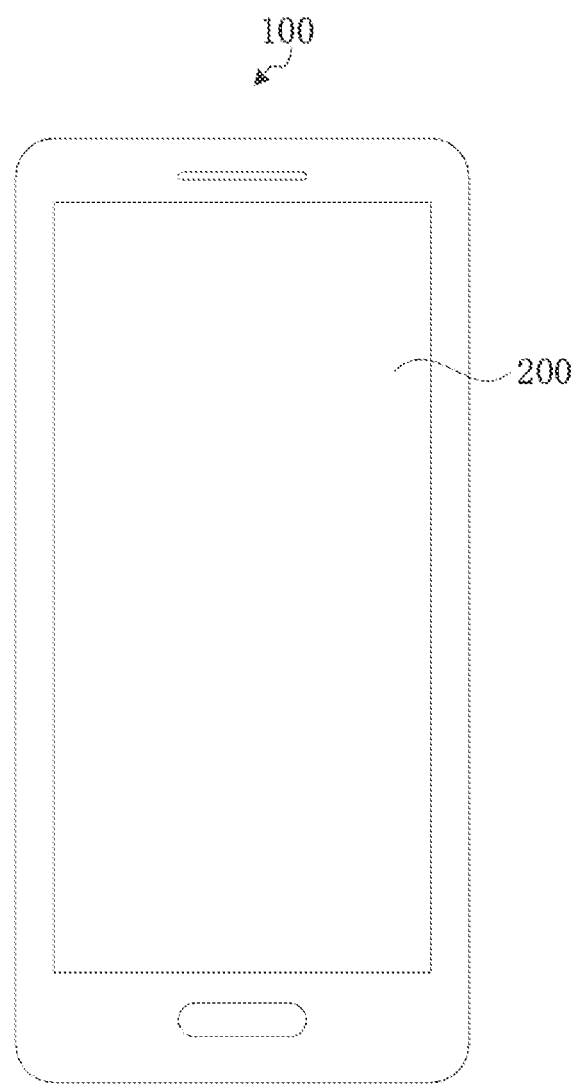
FIG. 9 is a schematic diagram of a flexible display device provided by an embodiment.

The present disclosure further provides a flexible display device. FIG. 9 is a schematic diagram of a flexible display device provided by an embodiment. Referring to FIG. 9, the flexible display device 100 includes the flexible display panel 200 of any embodiment of the present disclosure. The flexible display device 100 may be flexible display equipment such as a mobile phone, a tablet computer and a smart watch.

Figure 10:
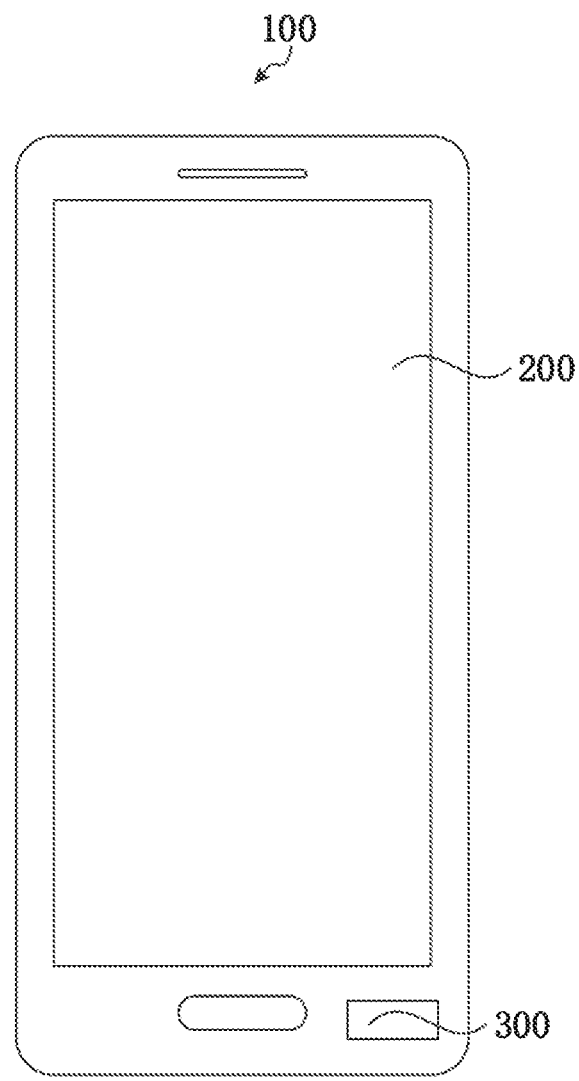
FIG. 10 is a schematic diagram of another display device provided by an embodiment.

FIG. 10 is a schematic diagram of another flexible display device provided by an embodiment. In the embodiment, referring to FIG. 10, the display device 100 may further include a drive circuit board 300, which is configured to send a display drive signal to the display panel 200 and enable the display panel 200 displays a corresponding screen.

What is claimed is:

1. A flexible display panel, comprising: a display area; and a non-display area surrounding the display area; wherein the non-display area comprises a flexible substrate, an inorganic layer and a metal wire stacked together, the non-display area and a bending area of the flexible display panel has an overlapping area formed therebetween, wherein in the overlapping area, at least one groove is formed on the inorganic layer, and the metal wire is at least partially arranged in the at least one groove, wherein the flexible substrate comprises a first flexible layer, a first inorganic layer and a second flexible layer; wherein the second flexible layer is arranged at a side of the first inorganic layer adjacent to the metal wire; along a direction perpendicular to the flexible substrate, the at least one groove passes through the second flexible layer, or the at least one groove passes through the second flexible layer and the first inorganic layer.

2. The flexible display panel of claim 1, wherein the at least one groove has a length same as that of the overlapping area along an, extension direction of the metal wire, and a portion of the metal wire in the overlapping area is located in the at least one groove.

3. The flexible display panel of claim 2, wherein the portion of the metal wire in the overlapping area is attached to an inner wall of the at least one groove.

4. The flexible display panel of claim 1, wherein a depth of the at least one groove is equal to a thickness of the inorganic layer by completely etching the inorganic layer at the at least one groove.

5. The flexible display panel of claim 1, wherein the inorganic layer comprises a buffer layer and at least one insulating: layer stacked together; wherein the buffer layer is arranged at a side of the at least, one insulating layer adjacent to the flexible substrate; the at least one groove passes through all of the at least one insulating layer in the inorganic layer along a direction perpendicular to the flexible substrate.

6. The flexible display panel of claim 5, wherein the inorganic layer comprises the buffer layer; a first insulating layer, a second insulating layer and a third insulating layer stacked together; wherein the at least one groove passes through the first insulating layer, the second insulating layer and the third insulating layer along the direction perpendicular to the flexible substrate.

7. The flexible display panel of claim 1, wherein a planarization layer and a pixel definition layer are arranged at a side of the metal wire far away from the inorganic layer, wherein the pixel definition layer is arranged at a side of the planarization layer far away from the metal wire.

8. The flexible display panel of claim 7, wherein a sum of a thickness of the planarization layer and a thickness of the pixel definition layer is equal to a thickness of the first flexible layer.

9. The flexible display panel of claim 1, wherein a cross-sectional shape of the at least one groove is a trapezoid along a direction perpendicular to the flexible substrate and parallel to an extension direction of the metal wire, and a short side of the trapezoid is close to the flexible substrate.

10. The flexible display panel of claim 9, wherein the cross-sectional shape of the at least one groove is a trapezoid with rounded corners.

11. The flexible display panel of claim 1, wherein a plurality of through-holes is arranged on the metal wire in the overlapping area.

12. The flexible display panel of claim 1, wherein the metal wire has a width greater than or equal to 30 microns.

13. The flexible display panel of claim 1, wherein the metal wire comprises a power signal line and a clock signal line.

14. A flexible display device, comprising a flexible display panel, wherein the flexible display panel comprises: a display area; and a non-display area surrounding tire display area; wherein the non-display area comprises a flexible substrate, an inorganic layer and a metal wire stacked together, an overlapping area exists between the non-display area and a bending area of the flexible display panel, wherein in the overlapping area, at least one groove is formed on the inorganic layer, and the metal wire is at least partially arranged is the at least one groove, wherein the flexible substrate comprises a first flexible layer, a first inorganic layer and a second flexible layer; wherein the second flexible layer is arranged at a side of the first inorganic layer adjacent to the metal wire; along a direction perpendicular to the flexible substrate, the at least one groove passes through the second flexible layer, or the at least one groove passes through the second flexible layer and the first inorganic layer.

15. The flexible display device of claim 14, further comprising: a drive circuit board, which is configured to send a display drive signal to the flexible display panel.

* * * * *